United States Patent [19]

Uga et al.

[11] Patent Number: 5,480,816
[45] Date of Patent: Jan. 2, 1996

[54] METHOD OF FABRICATING A BIPOLAR TRANSISTOR HAVING A LINK BASE

[75] Inventors: Kimiharu Uga; Hiroki Honda; Masahiro Ishida; Yoshiyuki Ishigaki, all of Itami, Japan

[73] Assignee: Mitsubishi Denki Kabushiki Kaisha, Tokyo, Japan

[21] Appl. No.: 273,915

[22] Filed: Jul. 12, 1994

Related U.S. Application Data

[62] Division of Ser. No. 970,828, Nov. 3, 1992, abandoned.

[30] Foreign Application Priority Data

Feb. 17, 1992 [JP] Japan .................................... 4-029562

[51] Int. Cl.$^6$ ....................... H01L 21/265; H01L 21/225; H01L 21/385
[52] U.S. Cl. ............................... 437/31; 437/33; 437/164
[58] Field of Search .................... 437/31, 152, 160, 437/164, 168, 33; 148/DIG. 9, DIG. 10

[56] References Cited

U.S. PATENT DOCUMENTS

| | | | |
|---|---|---|---|
| 4,252,582 | 2/1981 | Anantha et al. | 437/31 |
| 4,839,305 | 6/1989 | Brighton | 437/31 |
| 4,988,632 | 1/1991 | Pfiester | 437/31 |
| 5,023,192 | 6/1991 | Josquin et al. | 437/31 |
| 5,032,532 | 7/1991 | Mori et al. | 437/164 |
| 5,037,768 | 8/1991 | Cosentino | 437/31 |
| 5,162,245 | 11/1992 | Favreau | 437/31 |
| 5,235,206 | 8/1993 | Desilets et al. | 257/578 |
| 5,254,485 | 10/1993 | Sagawa et al. | 437/31 |
| 5,302,535 | 4/1994 | Imai et al. | 437/31 |
| 5,342,797 | 8/1994 | Sapp et al. | 437/164 |

*Primary Examiner*—Olik Chaudhuri
*Assistant Examiner*—Brian K. Dutton
*Attorney, Agent, or Firm*—Oblon, Spivak, McClelland, Maier & Neustadt

[57] ABSTRACT

On an epitaxial layer (4) serving as a collector layer are formed an emitter layer (10), an intrinsic base layer (9) surrounding the emitter layer (10) while permitting the surface of the emitter layer (10) to be exposed, external base layers (8) and link base layers (7) lying between the intrinsic base layer (9) and external base layers (8). The intrinsic base layer between the emitter layer and the epitaxial layer serving as the collector layer has a relatively high impurity concentration, so that a collector-emitter breakdown voltage is not decreased. The link base layers between the intrinsic base layer and external base layers has a relatively low impurity concentration to suppress decrease in emitter-base junction breakdown voltage.

13 Claims, 9 Drawing Sheets

5,480,816

METHOD OF FABRICATING A BIPOLAR TRANSISTOR HAVING A LINK BASE

This is a division of application Ser. No. 07/970,828, filed on Nov. 3, 1992 now abandoned.

BACKGROUND OF THE INVENTION

1. Field of the Invention

The present invention relates to a semiconductor device and a method of fabricating the same. More particularly, the invention relates to a bipolar transistor.

2. Description of the Background Art

FIGS. 11 to 13 are cross-sectional views showing a method of fabricating a conventional bipolar transistor in sequence of fabrication.

There is initially provided a p type silicon substrate 1 having a low impurity concentration. A high-concentration n type collector buried layer 2 and p type buried layers 3 are formed on the silicon substrate 1. A low-concentration n⁻ type epitaxial layer 4 is grown on the silicon substrate 1 and buried layers 2 and 3. Oxide and nitride films (not shown) are deposited on the epitaxial layer 4, and the nitride film is left behind only in a region in which a bipolar transistor is to be formed (hereinafter referred to as an "active region"). Channel-cut high-concentration p type impurity ions are implanted by using a resist mask (not shown). Thick oxide films 110 for isolation are formed by selective oxidation, using the nitride film as a mask. At the same time, p type channel-cut layers 5 are formed. The isolation of the transistor to be formed later is achieved by both the p type buried layers 3 and the p type channel-cut layers 5. The epitaxial layer 4 is selectively exposed, using a resist mask (not shown). Ion implantation of high-concentration n type impurities and heat treatment are carried out to form a collector wall layer 6. The surface of the epitaxial layer 4 is selectively exposed in the active region. A polysilicon film is formed over the top surface, and high-concentration p type impurity ions are implanted into the polysilicon film. The polysilicon film is patterned by using a resist mask (not shown), so that an ion-implanted polysilicon film 200 is left behind. An oxide film 120 is then deposited over the top surface at low temperatures (FIG. 11).

The oxide film 120 and polysilicon film 200 are selectively etched off using a resist mask (not shown) to expose the surface of the epitaxial layer 4. The selectively remaining polysilicon film 200 becomes external base electrodes 201. The exposed surface of the epitaxial layer 4 is oxidized to form a thin oxide film 130. Ions of p type impurity for intrinsic base are implanted through the oxide film 130 to form a p type impurity implanted layer 7a (FIG. 12).

An oxide film is deposited over the top surface and is dry etched all over, so that a side wall oxide film 140 is formed only on the end face of the base electrode 201 and the impurity implanted layer 7a is exposed. A polysilicon film is deposited over the top surface. High-concentration n type impurity ions are implanted into the polysilicon film, which is in turn patterned to form an emitter electrode 210. The introduced impurities are diffused by heat treatment, to form an intrinsic base layer 7, external base layers 8 and an emitter layer 9.

FIG. 14 shows a cross-sectional structure of the transistor thus fabricated, and FIG. 15 shows an impurity profile (around the emitter layer 9) where the structure is taken along the line XX' of FIG. 14.

When the base layer 7 is made thin for high performance of the transistor, a high impurity concentration of the base layer 7 is required in order to ensure a collector-emitter breakdown voltage. In this case, the impurity concentration of the base layer 7 grows high around the emitter, particularly in a surface portion 7c, so that an emitter-base junction breakdown voltage decreases disadvantageously.

SUMMARY OF THE INVENTION

According to the present invention, a semiconductor device comprises: a semiconductor layer of a first conductivity type serving as a collector layer; a base layer of a second conductivity type selectively formed on the semiconductor layer; an external base layer of the second conductivity type formed adjacent to the base layer on the semiconductor layer, the impurity concentration of the external base layer being higher than that of the base layer and an emitter layer of the first conductivity type selectively formed in an upper surface of the base layer, the impurity concentration of the base layer between the emitter layer and the collector layer being higher than that of the base layer between the emitter layer and the external base layer.

The present invention is also directed to a method of fabricating a semiconductor device. According to the present invention, the method comprises the steps of: (a) providing a semiconductor layer of a first conductivity type (b) selectively forming an intrinsic base layer of a second conductivity type in an upper surface of the semiconductor layer; (c) forming a link base layer of the second conductivity type surrounding the intrinsic base layer in the upper surface of the semiconductor layer, the impurity concentration of the link base layer being lower than that of the intrinsic base layer; (d) forming an external base layer of the second conductivity type surrounding the link base layer in the upper surface of the semiconductor layer, the impurity concentration of the external base layer being higher than that of the intrinsic base layer; and (e) selectively forming an emitter layer of the first conductivity type in an upper surface of the intrinsic base layer.

Since the intrinsic base layer between the emitter layer and the semiconductor layer serving as the collector layer has a relatively high impurity concentration, a collector-emitter breakdown voltage is not decreased. Since the link base layer between the intrinsic base layer and external base layer has a relatively low impurity concentration, the link base layer suppresses decrease in emitter-base junction breakdown voltage.

As above described, the semiconductor device of the present invention achieves suppression of decrease in emitter-base junction breakdown voltage without decrease in collector-emitter breakdown voltage.

A primary object of the present invention is to provide a semiconductor device which is capable of improving an emitter-base junction breakdown voltage without decreasing a collector-emitter breakdown voltage. Another object of the present invention is to provide a method of suitably fabricating the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
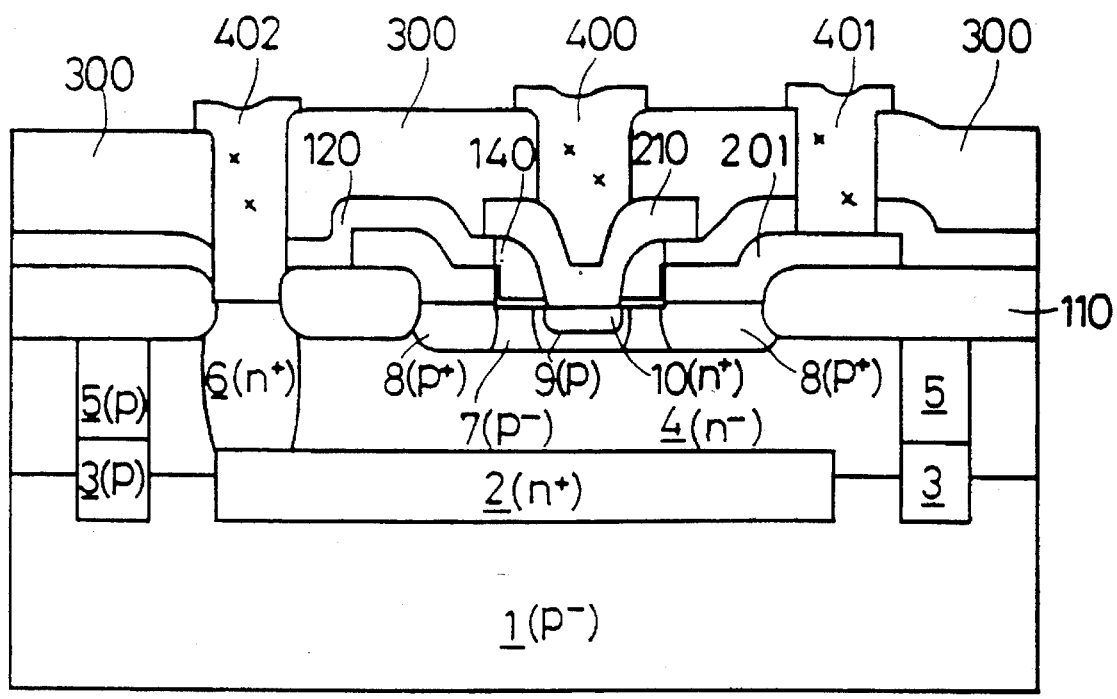
FIG. 1 is a cross-sectional view of a bipolar transistor according to a first preferred embodiment of the present invention.

FIG. 1 is a cross-sectional view of a bipolar transistor according to a first preferred embodiment of the present invention. FIGS. 3 to 7 are cross-sectional views showing major steps in a method of fabricating the bipolar transistor of FIG. 1.

In the same fashion as the prior art, there is initially provided a p type silicon substrate 1 having a low impurity concentration, and a high-concentration n type collector buried layer 2 and p type buried layers 3 are sequentially formed on the silicon substrate 1. A low-concentration n⁻ type epitaxial layer 4 is grown over the top surface.

Oxide and nitride films (not shown) are deposited on the epitaxial layer 4, and the nitride film is left behind only in an active region. Channel-cut high-concentration p type impurity ions are implanted by using a resist mask (not shown). Thick oxide films 110 for isolation are formed by selective oxidation, using the nitride film as a mask. At the same time, p type channel-cut layers 5 are formed. The isolation of the transistor is achieved by both the p type buried layers 3 and the p type channel-cut layers 5. The epitaxial layer 4 is selectively exposed, using a resist mask (not shown). Ion implantation of high-concentration n type impurities and heat treatment are carried out to form a collector wall layer 6.

The surface of the epitaxial layer 4 is selectively exposed. A polysilicon film of about 1500 to 2500 Å in thickness is deposited over the top surface. High-concentration p type impurity ions, for example $BF_2^+$, are implanted into the polysilicon film at an implantation rate (or a dose) of about $4 \times 10^{15}$ to $6 \times 10^{15}$ cm$^{-2}$ such that the ions stop in the polysilicon film. The ion-implanted polysilicon film is patterned by using a resist mask (not shown), so that a polysilicon film 200 is left behind. An oxide film 120 is then deposited over the top surface at low temperatures of, for example, 400 to 500° C. (FIG. 3) to prevent the p type impurities in the polysilicon film 200 from being diffused into the n⁻ type epitaxial layer 4.

Figure 4:
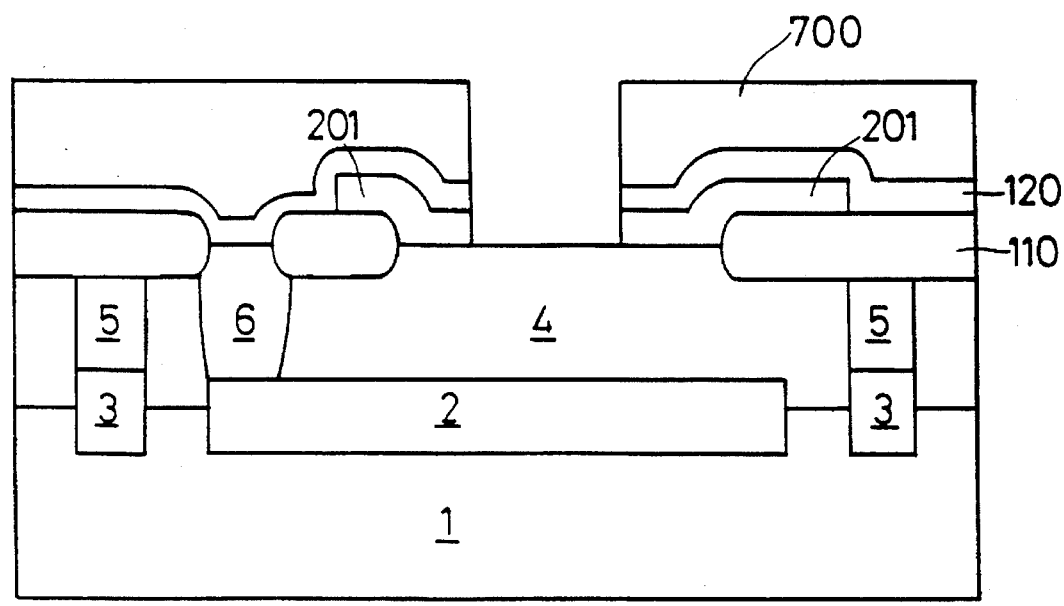

The oxide film 120 and polysilicon film 200 are selectively etched off in order using a resist 700 to expose the surface of the epitaxial layer 4. The selectively remaining polysilicon film 200 becomes external base electrodes 201 (FIG. 4).

Figure 5:
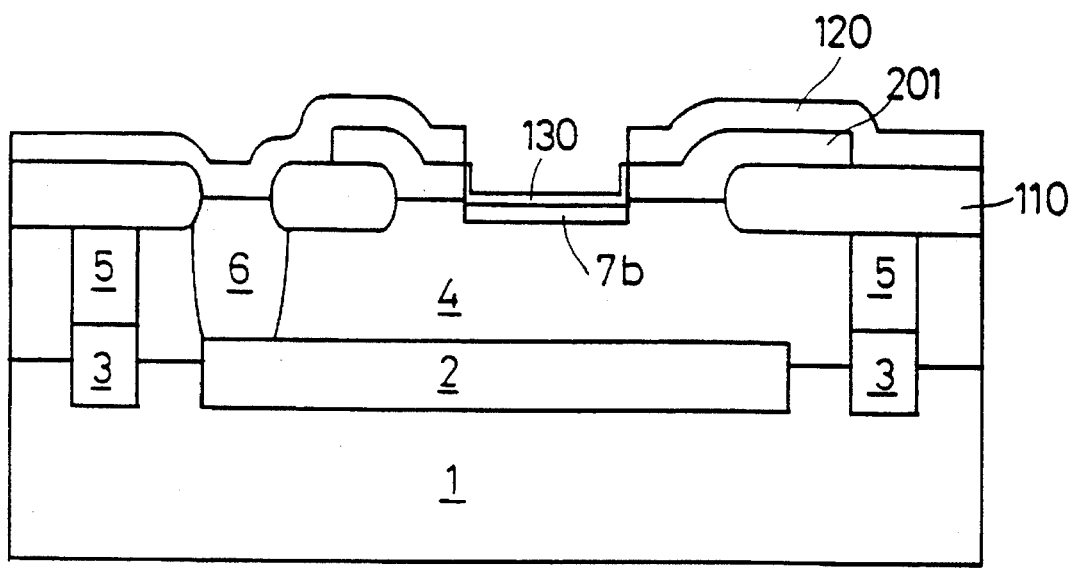

The exposed surface of the epitaxial layer 4 is oxidized thinly (with a thickness of 80 to 150 Å) to form an oxide film 130. Ions of p type impurity, for example $BF_2^+$, are implanted through the oxide film 130 at a low energy of 15 to 20 keV at a dose of $1 \times 10^{13}$ to $2 \times 10^{13}$ cm$^{-2}$ to form a p⁻ type impurity implanted layer 7b (FIG. 5).

Figure 6:
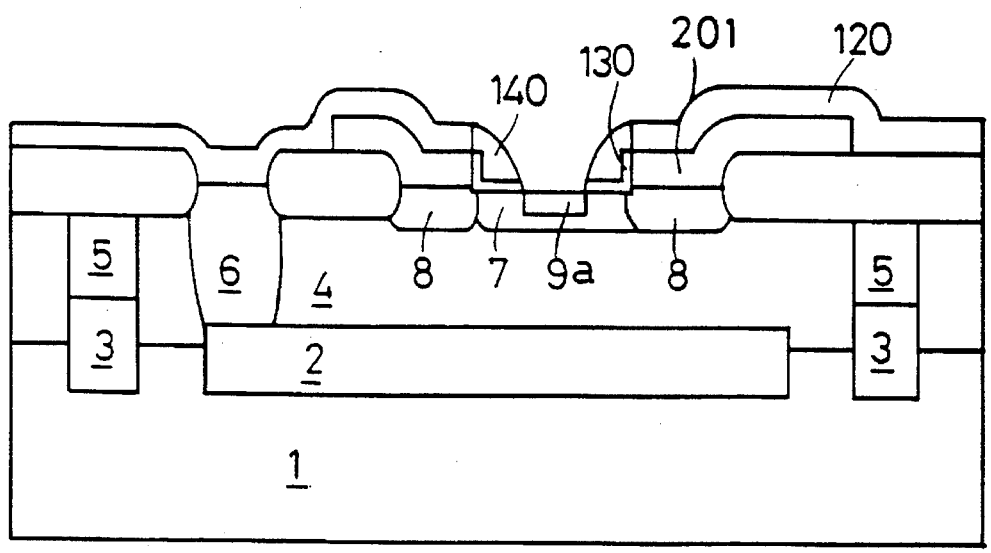

An oxide film is deposited over the top surface and is dry etched all over, so that side wall oxide films 140 are formed only on the end face of the base electrodes 201 and the impurity implanted layer 7b is exposed. Since heat treatment is slightly applied when the oxide films 130 and 140 are formed, the p type impurities are diffused from the external base electrodes 201 and impurity implanted layer 7b so that external base layers 8 and a p⁻ type link base layer 7 are formed. Ions of p type impurity for intrinsic base, for example $BF_2^+$, are implanted into the exposed p⁻ type link base layer 7 at an acceleration voltage of 10 to 15 keV at a dose of $1 \times 10^{14}$ to $1.5 \times 10^{14}$ cm$^{-2}$, which is an order of magnitude larger than the dose for the impurity implanted layer 7b, to form an intrinsic base p type impurity implanted layer 9a (FIG. 6).

A polysilicon film of 1500 to 2500 Å in thickness is deposited over the top surface. High-concentration n type impurity ions, for example As⁺, are implanted into the polysilicon film at an acceleration voltage of 50 keV at a dose of $5 \times 10^{15}$ to $1 \times 10^{16}$ cm$^{-2}$. The ion-implanted polysilicon film is patterned to form an emitter electrode 210.

Figure 7:
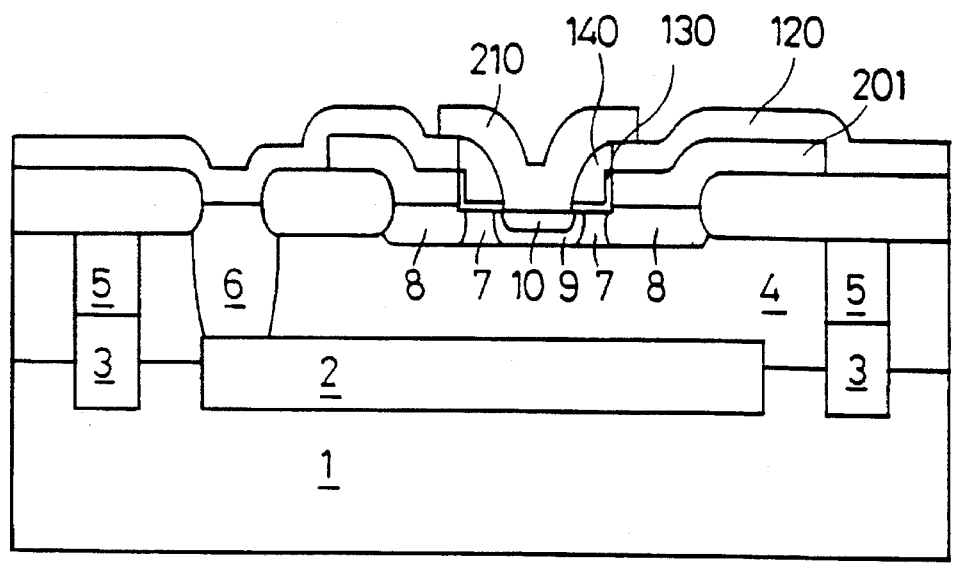

Heat treatment at high temperatures (850° to 900° C.) is performed to diffuse the impurities. This provides a p type intrinsic base layer 9 and an n⁺ type emitter layer 10 (FIG. 7).

A layer insulating film 300 is deposited over the top surface. Via holes for emitter, base and collector portions are opened through the layer insulating film 300. Emitter, base and collector electrodes 400, 401 and 402 formed of aluminium contact with the emitter electrode 210, the external base electrodes 201 and the collector wall layer 6, respectively (FIG. 1).

Figure 2:
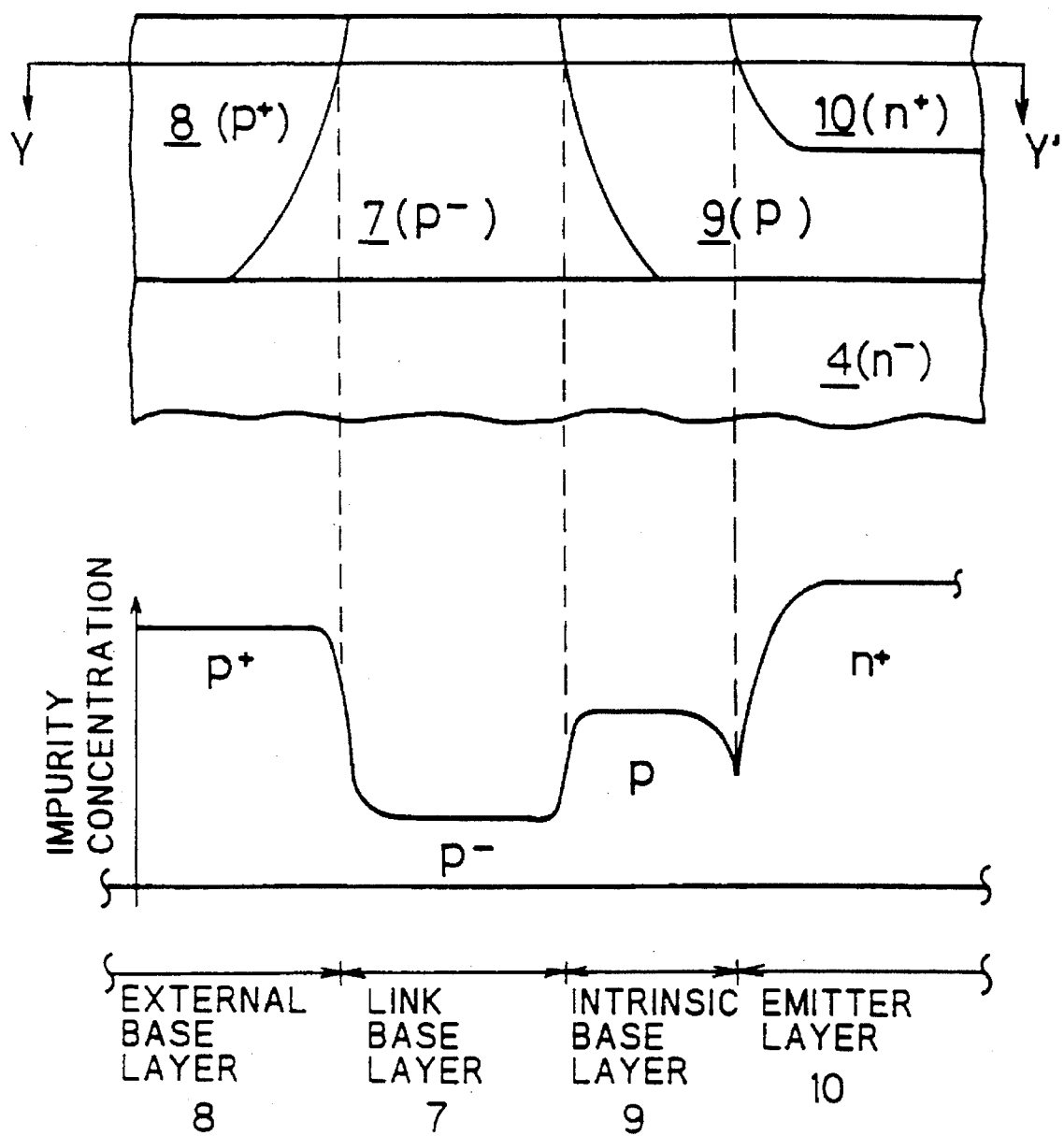
FIG. 2 shows an impurity concentration profile according to the first preferred embodiment.
Figure 3:
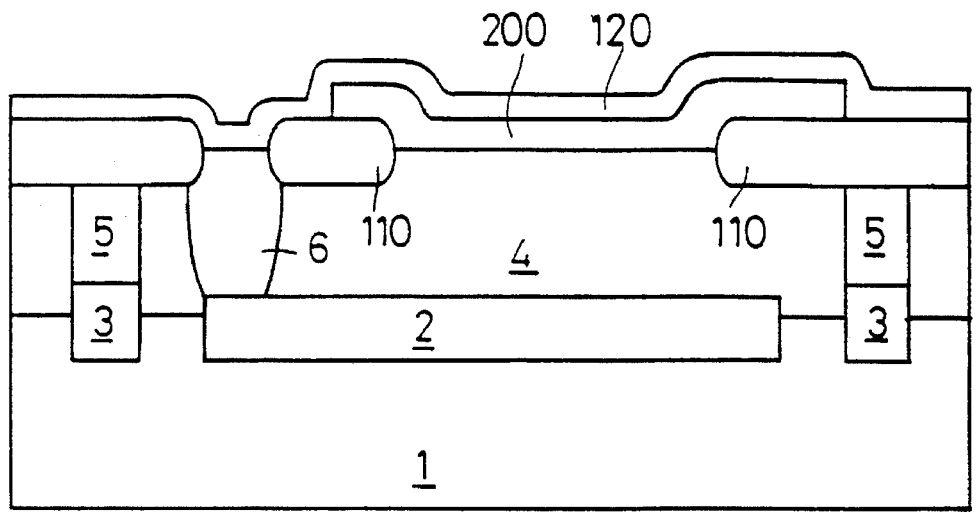
FIGS. 3 to 7 are cross-sectional views showing a method of fabricating the bipolar transistor of the first preferred embodiment in sequence of fabrication.

FIG. 2 shows a cross-sectional structure of the bipolar transistor of FIG. 1 and an impurity profile of the structure taken along the line YY' through the emitter layer 10, intrinsic base layer 9, link base layer 7 and external base layer 8. In the bipolar transistor formed as above described, since the intrinsic base layer 9 between the emitter layer 10 and the epitaxial layer 4 serving as a collector has a relatively high impurity concentration, a collector-emitter breakdown voltage is not decreased. The link base layer 7 between the intrinsic base layer 9 and external base layer 8, which has a relatively low impurity concentration, suppresses reduction in emitter-base junction breakdown voltage.

Figure 8:
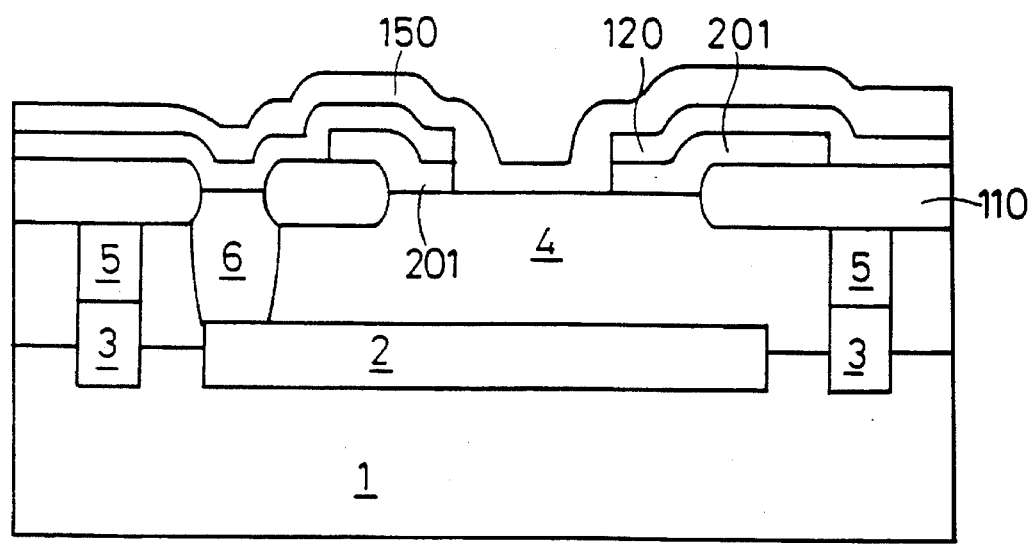
FIGS. 8 to 10 are cross-sectional views showing the method of fabricating the bipolar transistor in sequence of fabrication according to a second preferred embodiment of the present invention.
Figure 9:
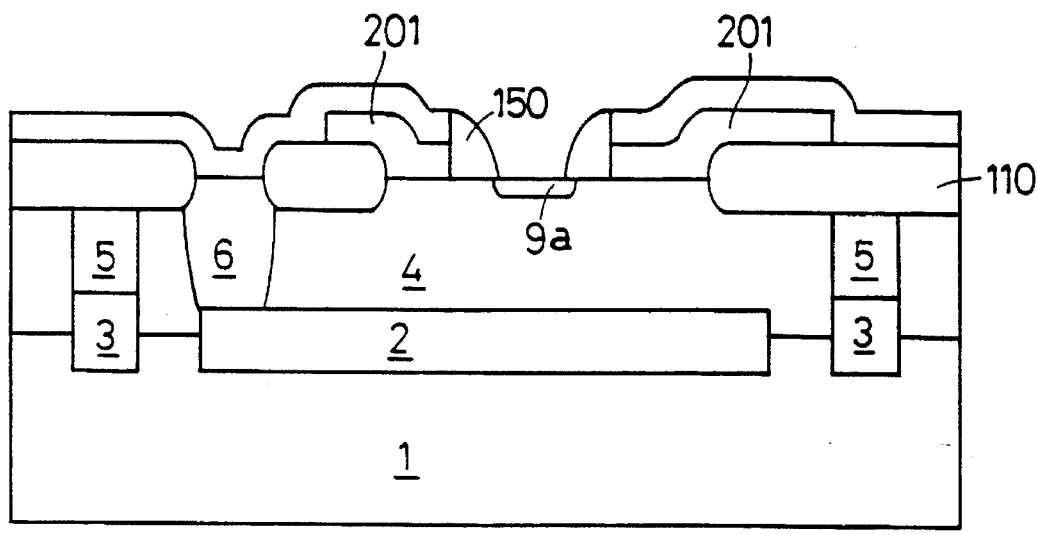
Figure 10:
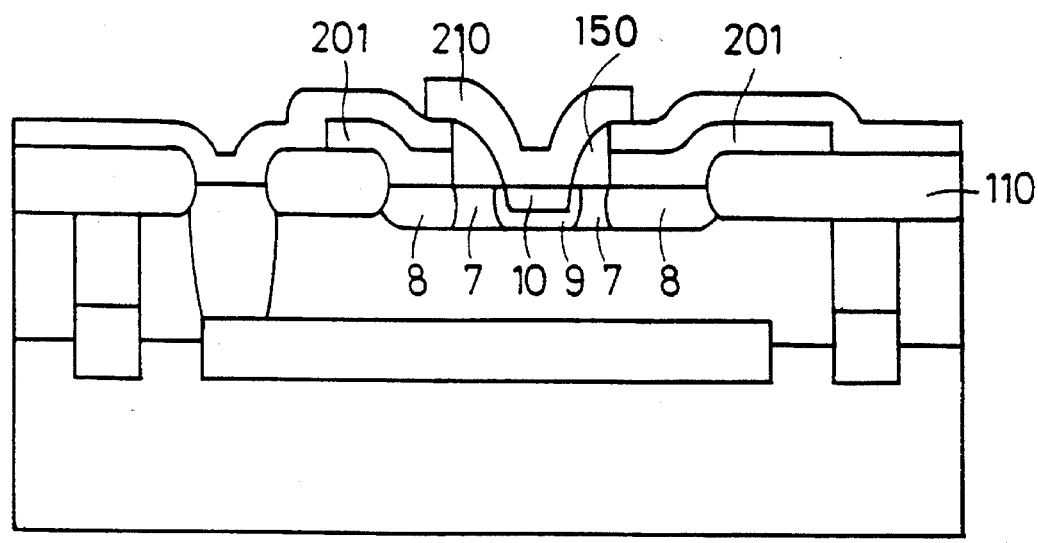
Figure 11:
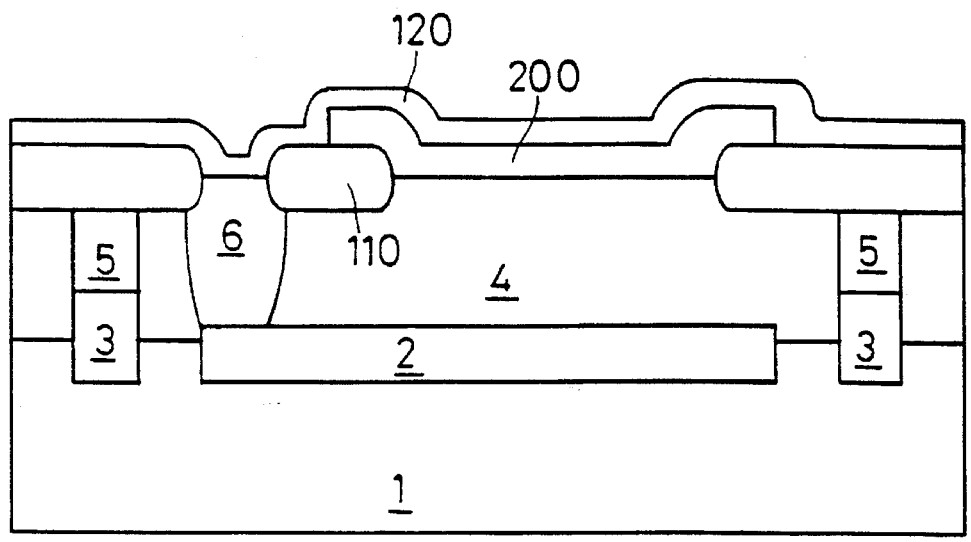
FIGS. 11 to 13 are cross-sectional views showing a method of fabricating a conventional bipolar transistor in sequence of fabrication.
Figure 12:
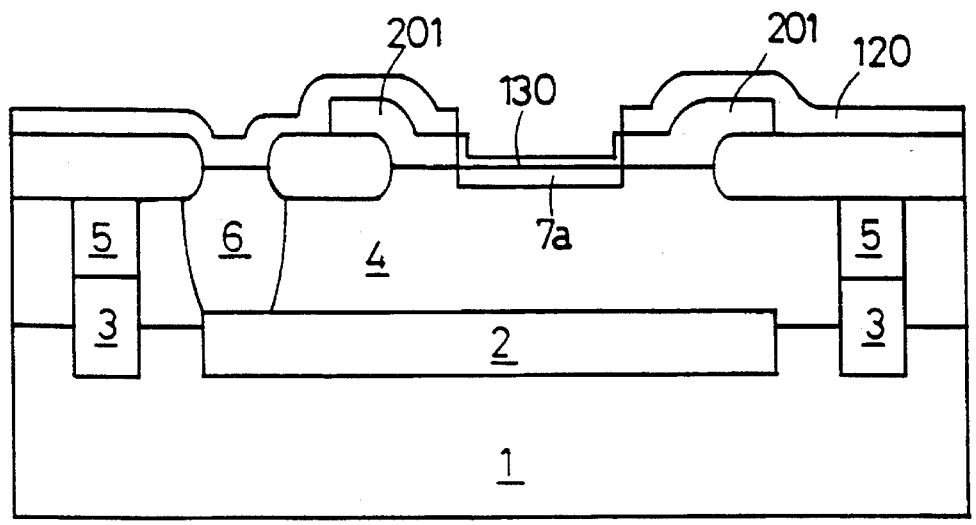
Figure 13:
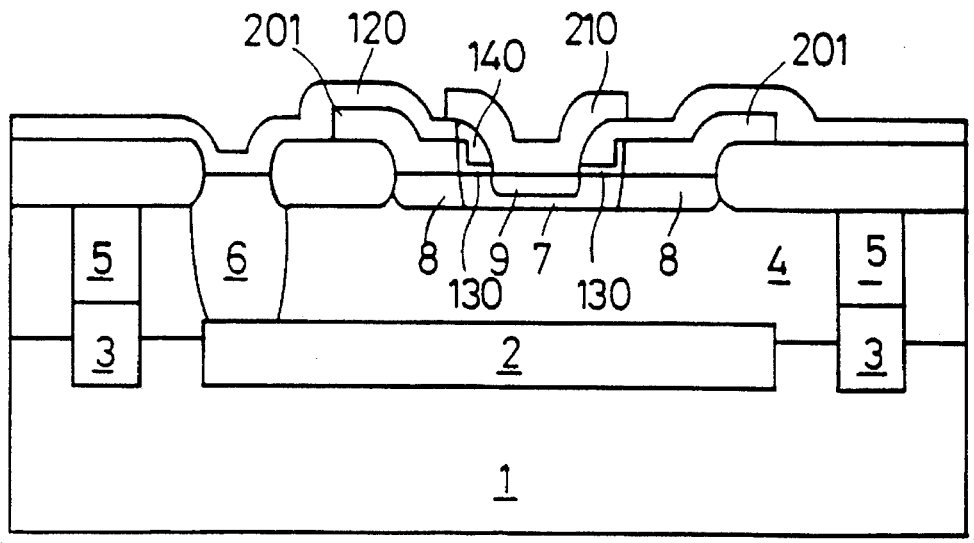
Figure 14:
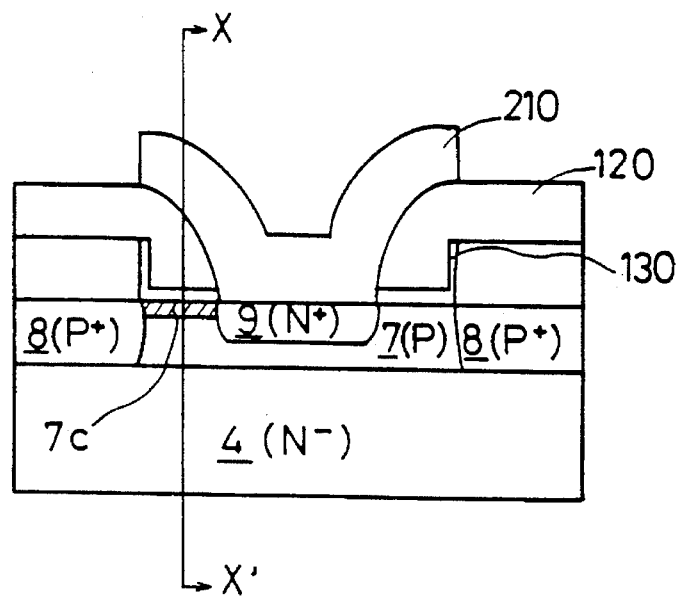
FIG. 14 is a cross-sectional view of the conventional bipolar transistor.
Figure 15:
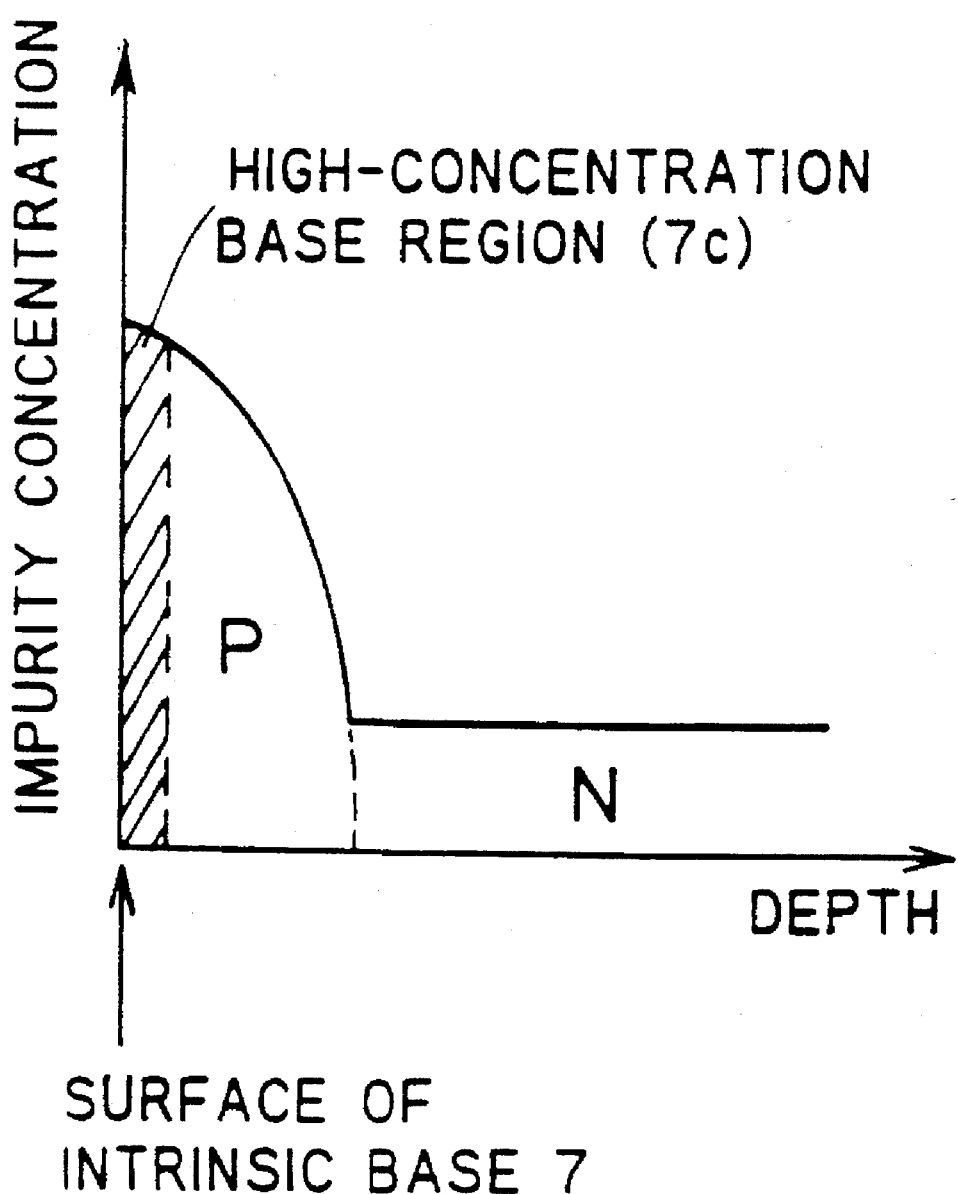
FIG. 15 shows an impurity concentration profile of the conventional bipolar transistor.

FIGS. 8 to 10 are cross-sectional views showing major steps in the method of fabricating the bipolar transistor according to a second preferred embodiment of the present invention. The step of exposing the epitaxial layer 4 as illustrated in FIG. 4 and its preceding steps in the first preferred embodiment are entirely the same as those in the second preferred embodiment. Subsequently, an oxide film having p type impurities, for example a BSG (Boron Silicate Glass) film 150, is deposited over the top surface (FIG. 8).

The oxide film is dry etched all over to leave the BSG film 150 behind only on the end face of the external base electrodes 201 in the form of side wall films. Impurity ions for intrinsic base such as $BF_2^+$ are implanted into the epitaxial layer 4 permitted to be exposed by the BSG films 150, to form the p type impurity implanted layer 9a (FIG. 9).

A polysilicon film of 1500 to 2500 Å in thickness is deposited over the top surface. High-concentration n type impurity ions, for example As⁺, are implanted into the polysilicon film at an acceleration voltage of 50 keV at a dose of about $5 \times 10^{15}$ to $1 \times 10^{16}$ cm$^{-2}$. The ion-implanted polysilicon film is patterned to form the emitter electrode

210.

Heat treatment is performed at high temperatures of, e.g., 850° to 900° C. This enables the ions to be diffused from the BSG films 150, the external base electrodes 201, the p type impurity implanted layer 9a and the emitter electrode 210 to form the p⁻ type link base layers 7, the p⁺ external base layers 8, p type intrinsic base layer 9 and n⁺ type emitter layer 10 (FIG. 10). At this time, boron concentration of the BSG films is adjusted such that the impurity concentration of the p⁻ type link base layers 7 is an order of magnitude smaller than that of the p type intrinsic base layer 9. The same succeeding steps as in the first preferred embodiment are carried out to provide the structure of FIG. 1.

The semiconductor device discussed in the first and second preferred embodiments is an NPN bipolar transistor. A PNP bipolar transistor may be provided in similar fashion.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device, comprising the steps of:
   (a) providing a semiconductor layer of a first conductivity type;
   (b) selectively forming an intrinsic base layer of a second conductivity type in an upper surface of said semiconductor layer;
   (c) forming a link base layer of the second conductivity type surrounding said intrinsic base layer in the upper surface of said semiconductor layer, the impurity concentration of said link base layer being lower than the impurity concentration of said intrinsic base layer;
   (d) forming an external base layer of the second conductivity type surrounding said link base layer in the upper surface of said semiconductor layer, the impurity concentration of said external base layer being higher than said impurity concentration of said intrinsic base layer; and
   (e) selectively forming an emitter layer of the first conductivity type in an upper surface of said intrinsic base layer.

2. The method of claim 1,
   wherein said step (d) includes the steps of:
   (d-1) selectively forming a first polycrystalline semiconductor layer having a first impurity of the second conductivity type on said semiconductor layer;
   (d-2) forming an opening in said first polycrystalline semiconductor layer, the remaining first polycrystalline semiconductor layer serving as an external base electrode; and
   (d-3) diffusing said first impurity from said external base electrode into the upper surface of said semiconductor layer to form said external base layer.

3. The method of claim 2, wherein said step (c) includes the steps of: (c-1) introducing a second impurity of the second conductivity type into the upper surface of said semiconductor layer exposed by said opening; and (c-2) diffusing said second impurity to form said link base layer.

4. The method of claim 3,
   wherein said step (c-1) includes the steps of:
   (c-1-1) forming a first oxide film on the upper surface of said semiconductor layer exposed by said opening; and
   (c-1-2) implanting ions of said second impurity into said semiconductor layer through said first oxide film.

5. The method of claim 4,
   wherein said step (b) includes the steps of:
   (b-1) forming a side wall on an end face of said external base electrode provided by said opening;
   (b-2) introducing a third impurity of the second conductivity type into an upper surface of said link base layer permitted to be exposed by said side wall and said external base electrode; and
   (b-3) diffusing said third impurity to form said intrinsic base layer.

6. The method of claim 5,
   wherein the formation of said side wall is accompanied by heat treatment, and
   wherein said steps (d-3) and (c-2) are carried out simultaneously by said heat treatment.

7. The method of claim 6,
   wherein said step (b-2) includes the step of (b-2-1) implanting ions of said third impurity at a dose larger than said second impurity.

8. The method of claim 7,
   wherein said step (e) includes the steps of:
   (e-1) forming a second polycrystalline semiconductor layer having a fourth impurity of the first conductivity type on said intrinsic base layer permitted to be exposed by said side wall and said external base electrode; and
   (e-2) diffusing said fourth impurity to form said emitter layer.

9. The method of claim 2,
   wherein said step (b) includes the steps of:
   (b-1) forming a side wall made from an insulating layer having a second impurity of the second conductivity type on an end face of said external base electrode provided by said opening;
   (b-2) introducing a third impurity of the second conductivity type into the upper surface of said semiconductor layer permitted to be exposed by said side wall and said external base electrode; and
   (b-3) diffusing said third impurity to form said intrinsic base layer.

10. The method of claim 9,
    wherein said step (c) includes the step of
    (c-1) diffusing said second impurity into the upper surface of said semiconductor layer to form said link base layer.

11. The method of claim 10,
    wherein said step (e) includes the steps of:
    (e-1) forming a second polycrystalline semiconductor layer having a fourth impurity of the first conductivity type on said semiconductor layer permitted to be exposed by said side wall and said external base electrode; and
    (e-2) diffusing said fourth impurity to form said emitter layer.

12. The method of claim 11,
    wherein said steps (d-3), (b-3), (c-1) and (e-2) are carried out simultaneously by heat treatment.

13. The method of claim 12,
    wherein said step (a) includes the step of
    (a-1) forming said semiconductor layer on a semiconductor substrate of the second conductivity type.

* * * * *